(12) United States Patent
Zhang

(10) Patent No.: US 7,476,122 B2
(45) Date of Patent: Jan. 13, 2009

(54) ELECTRICAL CONNECTOR

(75) Inventor: Jie-Feng Zhang, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/899,193

(22) Filed: Sep. 4, 2007

(65) Prior Publication Data

US 2008/0057751 A1    Mar. 6, 2008

(30) Foreign Application Priority Data

Sep. 1, 2006    (CN)    ................. 2006 1 0041428

(51) Int. Cl.
*H01R 13/00*    (2006.01)
(52) U.S. Cl. .................. 439/485; 439/487; 439/372; 439/331
(58) Field of Classification Search ................. 439/331, 439/341, 342, 372, 485, 487
See application file for complete search history.

(56) References Cited

U.S. PATENT DOCUMENTS

| 6,899,553 B2 * | 5/2005 | Ma et al. ................ 439/135 |
| 7,384,289 B2 * | 6/2008 | Minich .................. 439/206 |
| 2005/0059288 A1 * | 3/2005 | Lin et al. ................ 439/342 |
| 2007/0197077 A1 * | 8/2007 | Wang et al. ............. 439/326 |
| 2008/0014782 A1 * | 1/2008 | Yi et al. ................ 439/397 |
| 2008/0026629 A1 * | 1/2008 | Zhao et al. ............. 439/342 |
| 2008/0057751 A1 * | 3/2008 | Zhang .................. 439/73 |

* cited by examiner

*Primary Examiner*—James Harvey
(74) *Attorney, Agent, or Firm*—Wei Te Chung

(57) ABSTRACT

An electrical connector (1) for electrically connecting an electrical chip to a printed circuit board includes a base (3), a number of contacts, a stiffener (4) partially surrounding the base, a metal clip (5) pivotally assembled to one end of the stiffener, and a lever (6) pivotally assembled to opposite the other end of the stiffener. The base has a number of contact receiving passageways, and includes a mounting surface (314) for arranging the electrical chip and opposite connecting surface (315) for positioning to the printed circuit board. The contacts are received in the contact receiving passageways of the main body. The base defines a plurality of through slots (310) extending from mounting surface to the connecting surface thereof for transferring heat produced by the electrical chip outwardly.

15 Claims, 2 Drawing Sheets

ELECTRICAL CONNECTOR

BACKGROUND OF THE INVENTION

1. Field of the Invention

The present invention generally relates to an electrical connector, and more particularly to an electrical connector for removably mounting an electrical chip to a printed circuit board.

2. Description of Related Art

Connectors for mounting an electrical chip, such as a Central Processing Unit (CPU), to a printed circuit board are widely used in electrical equipments. Such a connector usually includes a base, a plurality of contacts retained in the base, a fastening frame partially surrounding the housing, a metal clip and an operational lever attached to the fastening frame. The base has a mounting surface to which the electrical chip is mounted and a connecting surface attached to the printed circuit board. When mounting, the connector is mounted to the printed circuit board, then the electrical clip is assembled to the mounting surface of the base and the metal clip is rotatably to partially cover the electrical chip, finally rotating the operational lever to a close position for retaining the electrical chip to the base. The contacts retained in the base realize the electrical connection between the electrical chip and the printed circuit board.

However, the connector with above structures has at least the shortcomings as follows: since the electrical chip and the base are closely connected, the spared space between the electrical chip and the base is small. However, with the frequency of the electrical chip is higher and higher, the heat produced in the operating process of the electrical chip is more and more. The heat is collected in the spared space and cannot be transferred out in time, thus, causing the increase of the temperature of the electrical chip to influence the stability of the electrical connection between the electrical chip and the printed circuit board.

Therefore, it is desired to provide an improved electrical connector to stress the problems mentioned above.

BRIEF SUMMARY OF THE INVENTION

Accordingly, an object of the present invention is to provide an electrical connector which is helpful to heat transfer of an electrical chip.

In order to achieve the above-mentioned object, an electrical connector for electrically connecting an electrical chip to a printed circuit board comprises a base, a plurality of contacts, a stiffener partially surrounding the base, a metal clip pivotally assembled to one end of the stiffener, and a lever pivotally assembled to opposite the other end of the stiffener. The base has a plurality of contact receiving passageways, and comprises a mounting surface for arranging the electrical chip and opposite connecting surface for positioning to the printed circuit board. The contacts are received in the contact receiving passageways of the main body. The base defines a plurality of through slots extending from mounting surface to the connecting surface thereof for transferring heat produced by the electrical chip outwardly.

Other objects, advantages and novel features of the invention will become more apparent from the following detailed description of the present embodiment when taken in conjunction with the accompanying drawings.

DETAILED DESCRIPTION OF THE INVENTION

Figure 1:
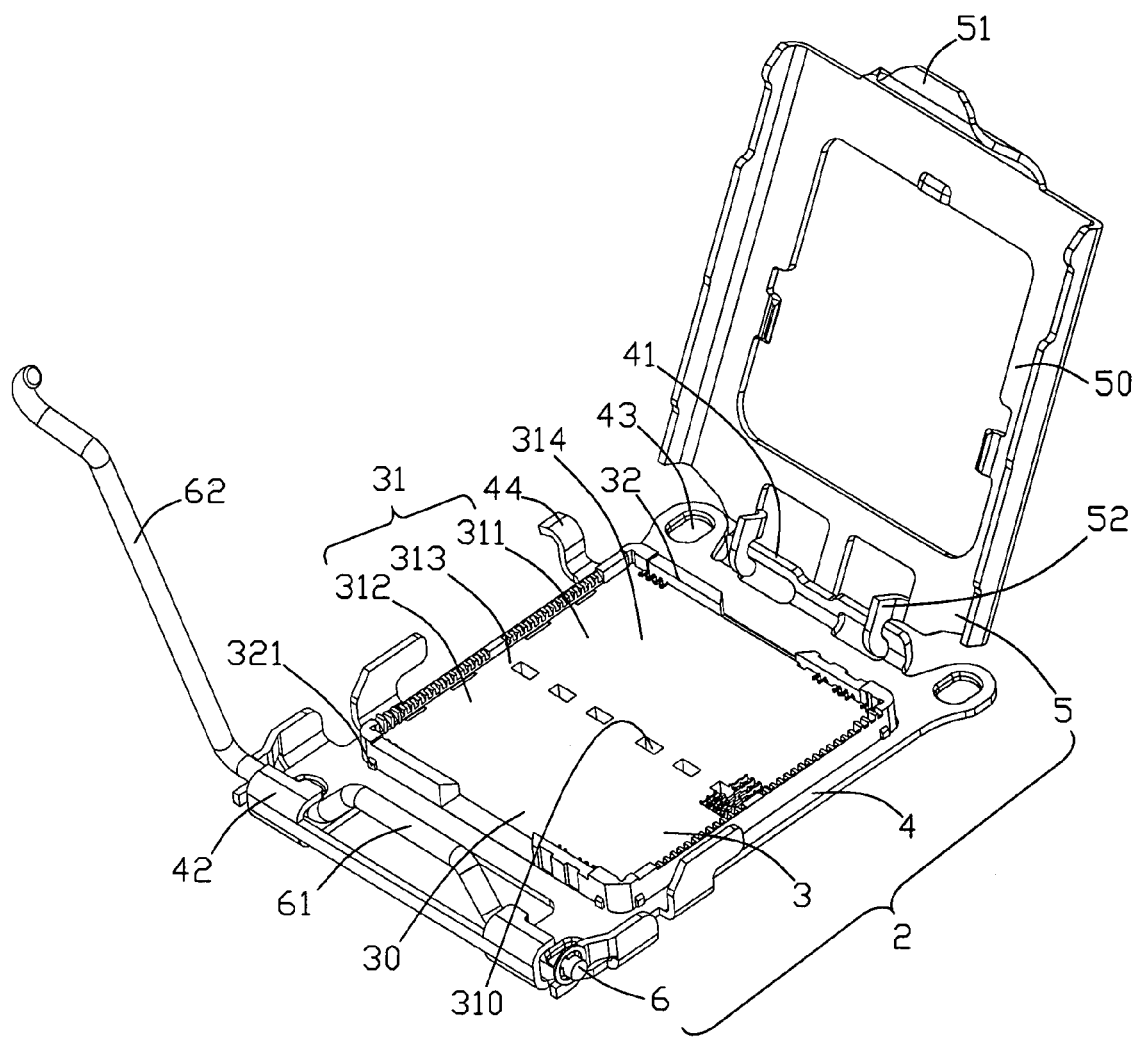
FIG. 1 is a perspective view of an electrical connector in accordance with the present invention with a metal clip in an opening position.

Reference will now be made to the drawing figures to describe the present invention in detail.

Figure 2:
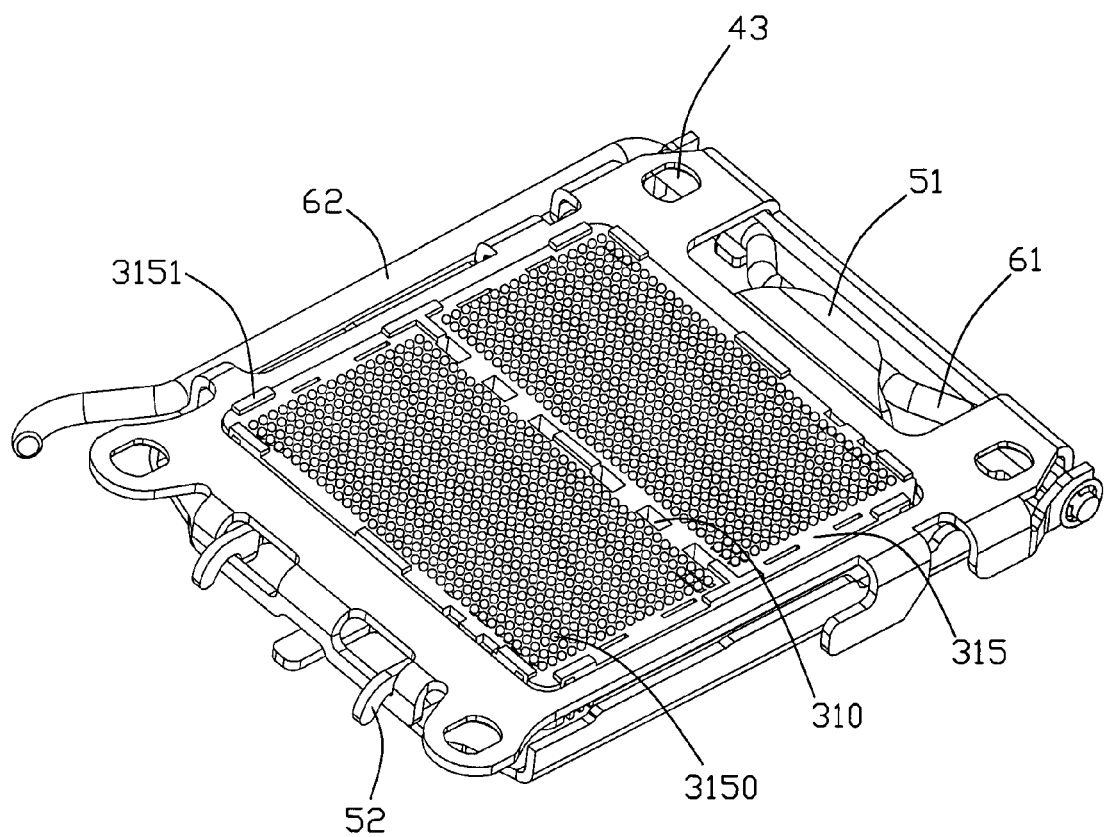
FIG. 2 is another perspective view of the electrical connector viewed from bottom, with the metal clip in an closed position.

Referring to FIGS. 1-2, an electrical connector 1 in accordance with the present invention is of LGA type and used to electrically connect an electrical chip (not shown) with a printed circuit board (not shown). The electrical connector 1 comprises a main body 2 and a plurality of contacts (not shown). The main body 2 comprises a base 3 housing the contacts, a metal stiffener 4 partially surrounding the base 3, a metal clip 5 and a lever 6 respectively pivotally mounted to and received in opposite ends of the metal stiffener 4.

The base 3 is substantially rectangular and comprises a main portion 31, surrounding walls 32 extending upwardly from four sides of the main portion 31. The surrounding walls 32 together define a receiving space 30 to receive an electrical chip, such as a CPU, therein. The main portion 31 comprises an upper surface served as a mounting surface 314 for arranging the CPU thereon and a bottom surface served as a connecting surface 315 attached to a printed circuit board. The main portion 31 is divided into a first divisional section 3 11, opposite second divisional section 312 and a partitional section 313 arranged between the first and second divisional sections 311, 312. The main portion 31 defines a plurality of through slots 310 in the partitional section 313 and penetrating from the mounting surface 314 to the connecting surface 315 to form a plurality of air-convention channels. The sizes of the through slots 310 can be the same or different from one another according to actual needs. The main portion 31 also defines a plurality of contact receiving passageways (not shown) to receive the contacts. The tail portions of the contacts are arranged with a plurality of solder balls 3150 for connecting to the printed circuit board. The outer surfaces of the surrounding walls 321 are arranged with a plurality of protrusions 321 to interferentially engage with the metal stiffener 4 for realizing the reliably connection between the base 3 and the metal stiffener 4. The connecting surface 315 is formed with a plurality of standoffs 3151 for preventing the excessive melt of the solder balls 3150.

The metal stiffener 4 is of a substantially flat board and defines a window (not shown) in the center thereof to receive the base 3. Opposite relatively-short sides of the metal stiffener 4 upwardly extend to form mounting portion 41 for the pivotal mount of the metal clip 5 and a receiving portion 42 for receiving the lever 6. A plurality of retaining holes 43 are defined at four corners of the metal stiffener 4 to corporate with retaining means (not shown) for fastening the electrical connector 1 to the printed circuit board. A restricting section 44 laterally and upwardly extends form one relatively-long side of the metal stiffener 4 which connects with the relatively-short sides for urging the metal clip 5 to the base 3.

The lever 6 is substantially L-shape and comprises an actuating portion 61 for pressing the metal clip 5 and an operating portion 62 restricted by the restricting section 44.

The metal clip 5 is of a substantially flat board and comprises a main portion 50 pivotally covering upper-surface of the electrical chip. An engaging portion 51 extends arcuately from an end of the main portion 50. A pair of spaced hooks 52 is formed at the opposite end of the main portion 50 for pivotally retaining to the mounting portion 41. The actuating portion 61 presses on the engaging portion 51 to reliably retain the electrical chip.

When assembly, the base 3 is retained to the metal stiffener 4 via the protrusions 321 on the surrounding walls 32 thereof. The metal clip 5 and the lever 6 are assembled to the metal stiffener 4. Now, the hooks 52 pivotally lock to the mounting portion 41 of the metal stiffener 4 and the actuating portion 61 of the lever 6 rotatably retained in the receiving portion 42 of the metal stiffener 4. Then the electrical connector 1 is positioned to the printed circuit board via the bottom solder balls 3150. The electrical chip is arranged to be received in the receiving space 30 of the base 3, then rotating the metal clip 5 from opening position to closed position. The lever 6 is rotated until the operating portion 62 engages with the restricting section 44 to form reliable electrical connection between the electrical chip and the printed circuit board. Since the existence of the through slots 310 extending through the mounting surface 314 to the connecting surface 315 of the base 3, the heat produced in the operating process of the electrical chip can be transferred out through the through slots 310, therefore, the temperature of the electrical chip is decreased. The stable electrical connection between the electrical chip and the printed circuit board is assured.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector adapted for electrically connecting an electrical chip to a printed circuit board, comprising:
    a base having a plurality of contact receiving passageways, and comprising a mounting surface adapted for arranging the electrical chip and opposite connecting surface adapted for positioning to the printed circuit board;
    a plurality of contacts received in the contact receiving passageways of the main body;
    a stiffener partially surrounding the base;
    a metal clip pivotally assembled to one end of the stiffener; and
    a lever pivotally assembled to opposite the other end of the stiffener; and wherein
    the base defines a plurality of through slots extending from mounting surface to the connecting surface thereof adapted for transferring heat produced by the electrical chip outwardly.

2. The electrical connector as claimed in claim 1, wherein the sizes of the through slots are different from one another.

3. The electrical connector as claimed in claim 1, said base comprises a plurality of divisional sections and partitional sections arranged between two adjacent divisional sections, and wherein said through slots are defined in the partitional sections.

4. The electrical connector as claimed in claim 1, wherein the contacts are arranged with a plurality of solder balls on tail portions thereof adapted for soldering to said printed circuit board.

5. The electrical connector as claimed in claim 1, wherein the stiffener defines a window in the center to receive the base, a mounting portion at one end to which the metal clip is pivotally mounted and a receiving portion opposite to the mounting portion to which the lever is pivotally mounted.

6. The electrical connector as claimed in claim 1, wherein the lever comprises an actuating portion pressing the metal clip and an operating portion restricted by the stiffener.

7. The electrical connector as claimed in claim 6, wherein the clip comprises a pair of hooks pivotally assembled to the stiffener and an engaging portion arcuately extending from the clip and pressed by the actuating portion of the lever.

8. The electrical connector as claimed in claim 1, the base comprises a partitional section and first and second divisional sections spaced by the partitional section, and wherein the through slots are aligned in one line along the partitional section.

9. An LGA connector assembly adapted for electrically connecting an electrical chip, comprising:
    a printed circuit board;
    a base with a plurality of contacts therein, each contact having tail portion soldered to the printed circuit board via a corresponding solder ball;
    a metal stiffener associatively surrounding said base and fastened to the printed circuit board;
    a clip rotatably mounted to the stiffener for retaining said electrical chip to the housing; and wherein
    the base defines a plurality of through slots therethrough to communicate with upper and lower surfaces of the base.

10. The LGA connector assembly as claimed in claim 9, wherein the base comprises a partitional section and first and second divisional sections spaced by the partitional section, and wherein the through slots are defined through the partitional section.

11. The LGA connector assembly as claimed in claim 10, wherein the contacts are only received in the first and second divisional sections.

12. The LGA connector assembly as claimed in claim 9, further comprising a lever pivotally assembled to the stiffener to press the clip adapted for retain the electrical chip to the base.

13. An electrical connector assembly comprising:
    a printed circuit board;
    a metallic frame fastened to the printed circuit board;
    an electrical connector including:
    an insulative rectangular housing located in the frame and having a receiving cavity, for receiving an electronic package, in an upper face surrounded by a circumferential wall;
    a plurality of contact areas formed in the housing under said receiving cavity and essentially fully occupying said rectangular housing; and
    a plurality of contacts disposed in the contact areas, each of said contacts being equipped with a solder ball on a bottom; wherein
    the housing further defines at least one heat ventilation slot between the contact areas, under a condition that the ventilation slot thermally dissipates heat occurring around the solder balls upwardly toward the receiving cavity.

14. The connector assembly as claimed in claim 13, wherein space between the contact areas is narrow so that said slot extends only along a longitudinal direction of the housing.

15. The connector assembly as claimed in claim 13, wherein said housing is engaged with the frame.

* * * * *